US012733472B2

(12) United States Patent
Motoyama et al.

(10) Patent No.: US 12,733,472 B2
(45) Date of Patent: Sep. 8, 2026

(54) DUAL DAMASCENE FULLY-ALIGNED VIA INTERCONNECTS WITH DUAL ETCH LAYERS

(71) Applicant: International Business Machines Corporation, Armonk, NY (US)

(72) Inventors: Koichi Motoyama, Clifton Park, NY (US); Kenneth Chun Kuen Cheng, Shatin (CN); Chanro Park, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 867 days.

(21) Appl. No.: 17/514,036

(22) Filed: Oct. 29, 2021

(65) Prior Publication Data

US 2023/0138988 A1 May 4, 2023

(51) Int. Cl.
*H10W 20/00* (2026.01)
*H10W 20/42* (2026.01)
*H10W 20/47* (2026.01)

(52) U.S. Cl.
CPC ....... *H10W 20/086* (2026.01); *H10W 20/075* (2026.01); *H10W 20/076* (2026.01); *H10W 20/42* (2026.01); *H10W 20/035* (2026.01); *H10W 20/037* (2026.01); *H10W 20/056* (2026.01); *H10W 20/47* (2026.01)

(58) Field of Classification Search
CPC ......... H01L 21/76816; H01L 21/76831; H01L 21/76832; H01L 21/7681; H01L 21/76846; H01L 21/76849; H01L 21/76883; H01L 23/5226; H01L 23/53295; H10W 20/42; H10W 20/077; H10W 20/076; H10W 20/075; H10W 20/47; H10W 20/056; H10W 20/069; H10W 20/435; H10W 20/081; H10W 20/033
See application file for complete search history.

(56) References Cited

U.S. PATENT DOCUMENTS

| | | | |
|---|---|---|---|
| 6,153,935 | A | 11/2000 | Edlelstein et al. |
| 6,358,832 | B1 | 3/2002 | Edlelstein et al. |
| 6,586,842 | B1 | 7/2003 | You et al. |
| 6,917,108 | B2 | 7/2005 | Fitzsimmons et al. |
| 8,299,617 | B2 | 10/2012 | Morrow et al. |
| 9,324,650 | B2 | 4/2016 | Edlelstein et al. |

(Continued)

*Primary Examiner* — John M Parker
(74) *Attorney, Agent, or Firm* — Scully, Scott, Murphy & Presser, P.C.; L. Jeffrey Kelly, Esq.

(57) ABSTRACT

A fully-aligned via interconnect structure is provided in which a first etch stop layer is formed on a first interconnect dielectric material layer containing an electrically conductive line structure to protect the interconnect dielectric material from eroding during metallization used in providing a combined via/line electrically conductive structure in a second interconnect dielectric material layer that is formed above the first interconnect dielectric material layer. The interconnect structure has low resistance due to the maximized contact between the via portion of combined via/line electrically conductive structure and the underlying electrically conductive line structure. Moreover, no bowing or metal fangs are formed, and no metal residue is introduced into the first interconnect dielectric material layer during metallization.

16 Claims, 7 Drawing Sheets

(56) References Cited

U.S. PATENT DOCUMENTS

| | | | | |
|---|---|---|---|---|
| 9,466,563 | B2 * | 10/2016 | Mignot | H01L 21/288 |
| 9,806,023 | B1 | 10/2017 | Briggs et al. | |
| 9,953,865 | B1 | 4/2018 | Briggs et al. | |
| 2002/0033535 | A1 * | 3/2002 | Babich | H01L 21/76814 257/E21.264 |
| 2007/0267751 | A1 * | 11/2007 | Yang | H01L 21/76814 257/758 |
| 2008/0014739 | A1 | 1/2008 | Matz et al. | |
| 2008/0258228 | A1 * | 10/2008 | Chuang | H01L 21/76895 257/E21.632 |
| 2009/0020879 | A1 * | 1/2009 | Lee | H01L 21/76895 257/E21.585 |
| 2010/0164074 | A1 | 7/2010 | King | |
| 2012/0199976 | A1 * | 8/2012 | Yang | H01L 21/76805 257/751 |
| 2016/0343708 | A1 * | 11/2016 | Park | H10D 30/6219 |
| 2019/0164885 | A1 * | 5/2019 | Yang | H01L 23/5283 |
| 2021/0287994 | A1 * | 9/2021 | Hsueh | H01L 21/76846 |
| 2021/0335661 | A1 * | 10/2021 | Chen | H01L 21/76831 |
| 2021/0384074 | A1 * | 12/2021 | Chen | H01L 21/76816 |

* cited by examiner

DUAL DAMASCENE FULLY-ALIGNED VIA INTERCONNECTS WITH DUAL ETCH LAYERS

BACKGROUND

The present application relates to semiconductor technology, and more particularly to a back-end-of-the-line (BEOL) interconnect structure including a fully-aligned via with dual etch stop layers.

Generally, BEOL interconnect devices include a plurality of circuits which form an integrated circuit fabricated on a BEOL interconnect substrate. A complex network of signal paths will normally be routed to connect the circuit elements distributed on the surface of the substrate. Efficient routing of these signals across the device requires formation of multilevel or multilayered schemes, such as, for example, single or dual damascene wiring, i.e., interconnect, structures.

Within typical BEOL interconnect structures, electrically conductive metal vias run perpendicular to the BEOL interconnect substrate and electrically conductive metal lines run parallel to the BEOL interconnect substrate. Typically, the electrically conductive metal vias are present beneath the electrically conductive metal lines and both features are embedded within an interconnect dielectric material layer.

A fully-aligned via (FAV) process is an effective way to provide an interconnect structure that has enhanced Vbd and reduced via resistance by confining the via in the line below. Normally, a high etch selective dielectric layer is required to achieve a FAV interconnect structure. However, since the etch selective dielectric layer is removed during a reactive ion etch used to open the via, the via profile of the interconnect dielectric material layer is modified during the following metallization step. Such via modification can cause bowing (i.e., bulging vias) and/or metal fang formation. Also, metal residue can be introduced into the interconnect dielectric material layer. There is thus a need to circumvent the above problems mentioned with conventional FAV processes.

SUMMARY

A fully-aligned via interconnect structure is provided in which a first etch stop layer is formed on a first interconnect dielectric material layer containing an electrically conductive line structure to protect the interconnect dielectric material from eroding during metallization used in providing a combined via/line electrically conductive structure in a second interconnect dielectric material layer that is formed above the first interconnect dielectric material layer. The interconnect structure has low resistance due to the maximized contact between the via portion of combined via/line electrically conductive structure and the underlying electrically conductive line structure. Moreover, no bowing or metal fangs are formed, and no metal residue is introduced into the first interconnect dielectric material layer during metallization.

In one aspect of the present application, an interconnect structure is provided. In one embodiment, the interconnect structure includes an electrically conductive line structure embedded in a first interconnect dielectric material layer. A combined via/line electrically conductive structure is also present and is embedded in a second interconnect dielectric material layer that is located above the first interconnect dielectric material layer. The combined via/line electrically conductive structure includes a lower via portion and an upper line portion, wherein the lower via portion of the combined via/line electrically conductive structure is fully-aligned to the electrically conductive line structure embedded in the first interconnect dielectric material layer. A dual etch stop layer structure is also present that includes a first etch stop layer and a second etch stop layer. The dual etch stop layer structure is located between the first interconnect dielectric material layer and the second interconnect dielectric material layer, and the first etch stop layer forms an interface with a topmost surface of the first interconnect dielectric material layer.

The term "fully-aligned" is used throughout the present application to denote that there is no misalignment between the via of the combined via/line electrically conductive structure and the underlying electrically conductive line structure. In the present application, this fully-aligned interconnect structure is provided by forming the via portion of the combined via/line electrically conductive structure in a line opening that also contains the electrically conductive line structure.

In another aspect of the present application, a method of forming an interconnect structure is provided. In one embodiment, the method includes forming a first etch stop layer selectively and only on a topmost surface of a first interconnect dielectric material layer, the first interconnect dielectric material layer includes an electrically conductive line structure embedded therein. The electrically conductive line structure is then recessed to provide a recessed electrically conductive line structure that has a topmost surface that is vertically offset and located beneath a topmost surface of the first interconnected dielectric material layer. A second etch stop layer is then formed on the first etch stop layer and the recessed electrically conductive line structure. Next, a second interconnect dielectric material layer is formed above the first interconnect dielectric material layer and on the second etch stop layer, wherein the second interconnect dielectric material layer includes a combined via/line opening having a lower via portion and an upper line portion, wherein the lower via portion physically exposes the second etch stop layer that is located on the recessed electrically conductive line structure. The physically exposed portion of the second etch stop layer that is located on the recessed electrically conductive line structure is then removed to physically expose the recessed electrically conductive line structure. A combined via/line electrically conductive structure is thereafter formed in the combined via/line opening including the lower via portion and the upper line portion, and on the recessed electrically conductive line structure.

DETAILED DESCRIPTION

Figure 1:
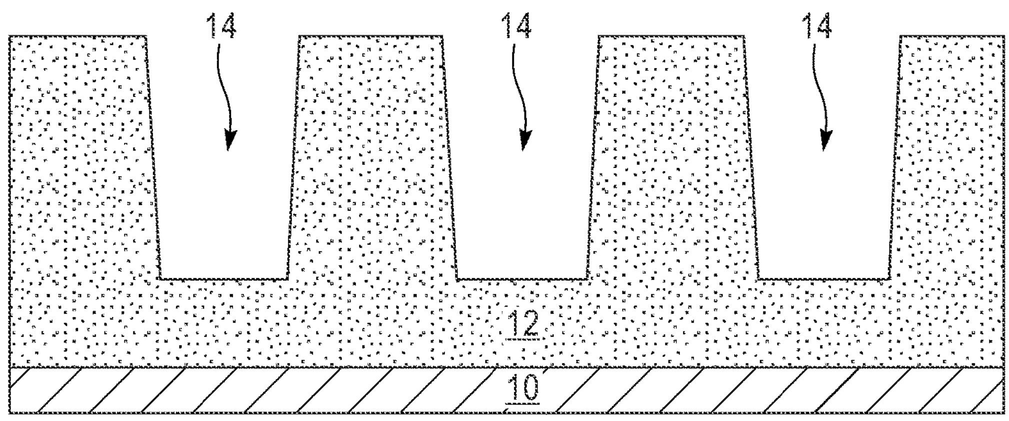
FIG. 1 is a cross sectional view of an exemplary structure that can be employed in accordance with an embodiment of the present application, the exemplary structure including a first interconnect dielectric material layer located on a surface of a substrate, wherein the first interconnect dielectric material layer contains a plurality of line openings formed therein.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary structure that can be employed in accordance with an embodiment of the present application. The exemplary structure shown in FIG. 1 includes a first interconnect dielectric material layer 12 located on a surface of a substrate 10, wherein the first interconnect dielectric material layer 12 contains a plurality of line openings 14 formed therein. In the drawings of the present application, the length of the at least one line opening 14 goes into and out of the plane of the drawing. The first interconnect dielectric material layer 12 is a component of a lower interconnected level of a multilevel interconnect structure.

Substrate 10 can include at least one other interconnect level containing electrically conductive structures embedded in an interconnect dielectric material, a middle-of-line (MOL) level containing electrically conductive contact structures embedded in a MOL dielectric material, a front-end-of-the-line (FEOL) level containing one or more semiconductor devices such as, for example, field effect transistor located on a surface of a semiconductor substrate, or any combination of the same.

The first interconnect dielectric material layer 12 can be composed of an inorganic dielectric material or an organic dielectric material. In some embodiments, the first interconnect dielectric material layer 12 can be porous, while in other embodiments, the first interconnect dielectric material layer 12 can be non-porous. Suitable dielectric materials that can be employed as the first interconnect dielectric material layer 12 include, but are not limited to, silicon dioxide, undoped or doped silicate glass, silsesquioxanes, C doped oxides (i.e., organosilicates) that include atoms of Si, C, O and H, theremosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl. The first interconnect dielectric material layer 12 can have a dielectric constant (all dielectric constants mentioned herein are measured relative to a vacuum, unless otherwise stated) that is about 4.0 or less. In one embodiment, the first interconnect dielectric material layer 12 has a dielectric constant of 2.8 or less. These dielectrics generally having a lower parasitic cross talk as compared to dielectric materials whose dielectric constant is greater than 4.0.

The first interconnect dielectric material layer 12 can be formed on substrate 10 by a deposition process such as, for example, chemical vapor deposition (CVD), plasma enhanced chemical vapor deposition (PECVD) or spin-on coating. The first interconnect dielectric material layer 12 can have a thickness from 50 nm to 250 nm. However other thicknesses that are lesser than 50 nm, and greater than 250 nm can also be employed in the present application as the thickness of the first interconnect dielectric material layer 12.

After forming the first interconnect dielectric material layer 12 on substrate 10, at least one line opening 14 is formed into the first interconnect dielectric material layer 12. The number of line openings 14 that are formed into the first interconnect dielectric material layer 12 can vary so long as at least one line opening 14 is formed. In FIG. 1 and by way of one example, three line openings 14 are formed into the first interconnect dielectric material layer 12. Each line opening 14 will subsequently house at least an electrically conductive line structure, as defined herein below. The at least one line opening 14 can be formed by lithography and etching. In some embodiments and as is illustrated in FIG. 1, the at least one line opening 14 is formed partially into the first interconnect dielectric material layer 12 such that a sub-portion (i.e., a portion of a layer/material that is located between a topmost surface and a bottom surface of that layer/material) of the first interconnect dielectric material layer 12 is located beneath the at least one line opening 14. In other embodiments (not shown), the at least line one opening 14 extends entirely through the first interconnect dielectric material layer 12 and physically exposes a surface of substrate 10. In yet further embodiments (also not shown), a first set of line openings 14 is formed partially into the first interconnect dielectric material layer 12 and a second set of line openings 14 is formed entirely through the first interconnect dielectric material layer 12.

Figure 2:
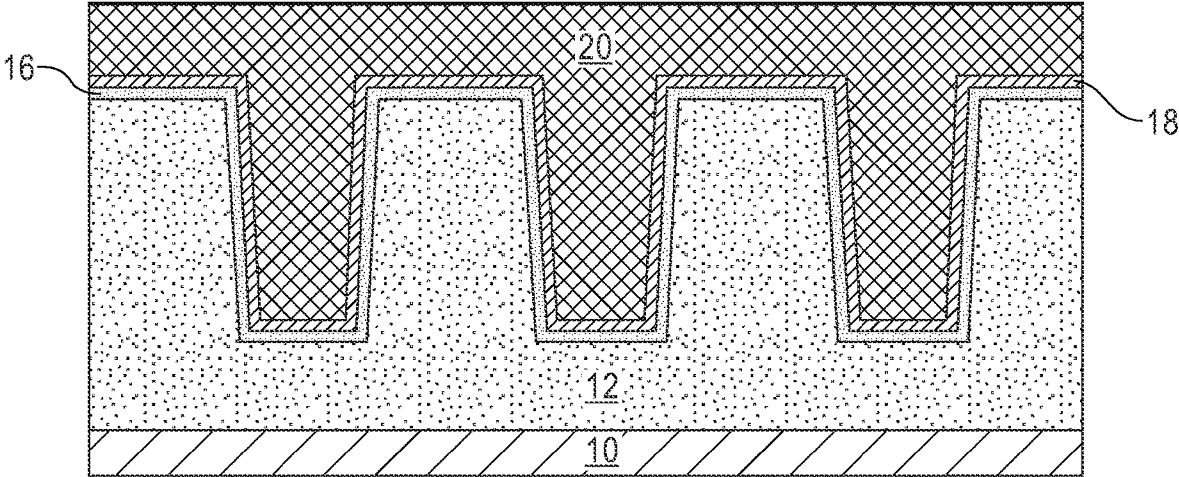
FIG. 2 is a cross sectional view of the exemplary structure shown in FIG. 1 after forming a first diffusion barrier material layer, a first metal liner material layer, and a first electrically conductive metal-containing layer in each of the line openings and on top of the first interconnect dielectric material layer.

Referring now to FIG. 2, there is illustrated the exemplary structure shown in FIG. 1 after forming a first diffusion barrier material layer 16, a first metal liner material layer 18, and a first electrically conductive metal-containing layer 20 in each of the line openings 14 and on top of the first interconnect dielectric material layer 12. In some embodiments, the first diffusion barrier material layer 16 and/or the first metal liner material layer 18 can be omitted from being formed. In the illustrated embodiment of the present application, the first diffusion barrier material layer 16 is formed first, followed by the first metal liner material liner 18 and thereafter the first electrically conductive metal-containing layer 20.

When present, the first diffusion barrier material layer 16 is composed of a diffusion barrier material such as, for example, Ta, TaN, Ti, TiN, Ru, RuN, RuTa, RuTaN, W, or WN. The diffusion barrier material serves as a barrier to prevent a conductive material from diffusing there through. The thickness of the first diffusion barrier material layer 16 can vary depending on the deposition process used as well as the material employed. In some embodiments, the first diffusion barrier material layer 16 has a thickness from 2 nm to 50 nm; although other thicknesses for the first diffusion barrier material layer 16 are contemplated and can be employed in the present application as long as the first diffusion barrier material layer 16 does not entirely fill the line openings 14 that are formed into the first interconnect dielectric material layer 12. The diffusion barrier material layer 16 can be formed by a deposition process including, for example, CVD, PECVD, atomic layer deposition (ALD), physical vapor deposition (PVD), sputtering, chemical solution deposition or plating. The first diffusion barrier material layer 16 is typically a conformal material layer. By "conformal material layer" it is meant that a material layer has a thickness along horizontal surfaces that is the same as a thickness of the same material layer along vertical surfaces.

When present, the first metal liner material layer 18 can be composed of a metal such as, for example, Ta, Ti, W, Co, Ru, or Rh, or alloys of said metals (e.g., Ta and one of Ti, W, Co, Ru, or Rh; Ti and one of Ta, W, Co, Ru, or Rh; W and one of Ta, Ti, Co, Ru or Rh; Co and one of Ta, Ti, W, Ru or Rh; Ru and one of Ta, Ti, W, Co, or Rh; of Rh and one of Ta, Ti, W, Co, or Ru). The thickness of the first metal liner material layer 18 can vary depending on the deposition process used as well as the material employed. In some embodiments, the first metal liner material layer 18 has a thickness from 2 nm to 50 nm; although other thicknesses for the first metal liner material layer 18 are contemplated and can be employed in the present application as long as the first metal liner material layer 18 alone, or in combination with the first diffusion barrier material layer 16 does not entirely fill the line openings 14 that are formed into the first interconnect dielectric material layer 12. The first metal liner material layer 18 can be formed by a deposition process such as, for example, CVD, PECVD, ALD, PVD or sputtering. The first metal liner material layer 18 is typically a conformal material layer.

The first electrically conductive metal-containing layer 20 is composed of an electrically conductive metal or electrically conductive metal alloy, which is typically, compositionally different from the first metal liner material layer 18. Examples of electrically conductive metals that can be employed in providing the first electrically conductive metal-containing layer 20 include, but are not limited to, Cu, Al, W, Co, Mo, Ru, Rh or Ir. Examples of electrically conductive metal alloys include, but are not limited to, a Cu—Al alloy. The first electrically conductive metal-containing layer 20 can be formed utilizing a deposition process such as, for example, CVD, PECVD, sputtering, chemical solution deposition or plating. In one embodiment, a bottom-up plating process can be employed in forming the first electrically conductive metal-containing layer 20.

Figure 3:
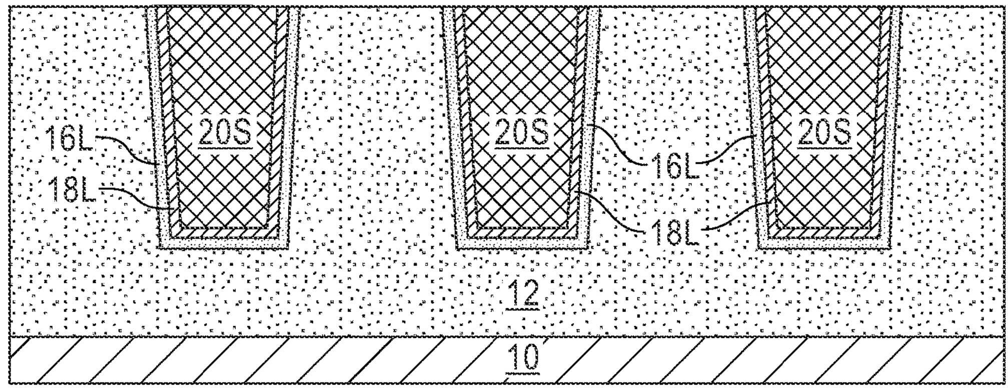
FIG. 3 is a cross sectional view of the exemplary structure shown in FIG. 2 after removing the first diffusion barrier material layer, the first metal liner material layer, and the first electrically conductive metal-containing layer that are located on top of the first interconnect dielectric material layer, while maintaining the first diffusion barrier material layer, the first metal liner material layer, and the first electrically conductive metal-containing layer in each line opening.

Referring now to FIG. 3, there is illustrated the exemplary structure shown in FIG. 2 after removing the first diffusion barrier material layer 16, the first metal liner material layer 18, and the first electrically conductive metal-containing layer 20 that are located on top of the first interconnect dielectric material layer 12, while maintaining the first diffusion barrier material layer 16, the first metal liner material layer 18, and the first electrically conductive metal-containing layer 20 in each line opening 14. The first diffusion barrier material layer 16 that is maintained in each line opening 14 can be referred to herein as a first diffusion barrier liner 16L. The first metal liner material layer 18 that is maintained in each line opening 14 can be referred to herein as a first metal liner 18L. The first electrically conductive metal-containing layer 20 that is maintained in each line opening 14 can be referred to herein as an electrically conductive line structure 20S.

The first diffusion barrier liner 16L and the first metal liner 18L are both U-shaped. By "U-shaped" it is meant that the liner has a horizontal portion and a vertical portion that extends upward from each end of the horizontal portion. In the illustrated embodiment, the U-shaped first metal liner 18L is located on the sidewalls and bottommost surface of the electrically conductive line structure 20S, and the U-shaped first diffusion barrier liner 16L is located on the U-shaped first metal liner 18L. Other structural configurations are possible depending on whether the first diffusion barrier material layer 16 and the first metal liner material layer 18 are employed.

In the illustrated embodiment, the electrically conductive line structure 20S has a topmost surface that is coplanar with a topmost surface of each of the first diffusion barrier liner 16L, the first metal liner 18L, and the first interconnect dielectric material layer 12. Other structural configurations are possible depending on whether the first diffusion barrier material layer 16 and the first metal liner material layer 18 are employed.

The removal of the first diffusion barrier material layer 16, the first metal liner material layer 18, and the first electrically conductive metal-containing layer 20 that are located on top of the first interconnect dielectric material layer 12 can be performed utilizing a planarization process such as, for example, chemical mechanical polishing (CMP) and/or grinding. In the illustrated embodiment, the planarization stops on a topmost surface of the first interconnect dielectric material layer 12.

Figure 4:
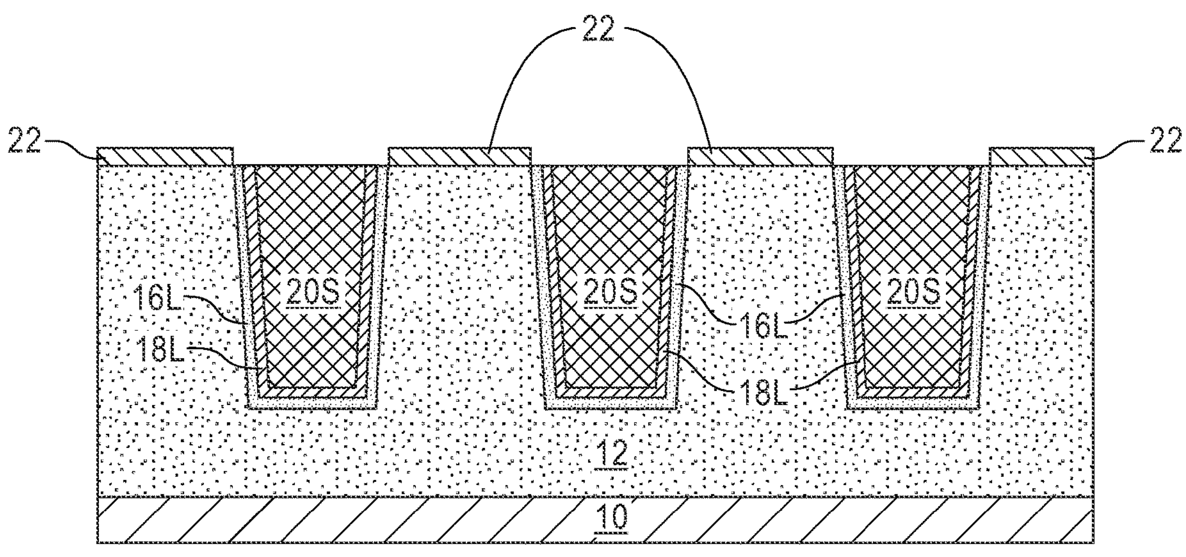
FIG. 4 is a cross sectional view of the exemplary structure shown in FIG. 3 after forming a first etch stop layer on the physically exposed topmost surface of the first interconnect dielectric material layer.

Referring now to FIG. 4, there is illustrated the exemplary structure shown in FIG. 3 after forming a first etch stop layer 22 on the physically exposed topmost surface of the first interconnect dielectric material layer 12; no first etch stop layer 22 is formed on the first diffusion barrier liner 16L, the first metal liner 18L and the electrically conductive line structure 20S that are present in the line openings 14. The first etch stop layer 22 can be composed of a first etch stop material such as, for example, aluminum oxide or parylene, which can be selectively deposited on only the horizontal topmost surface of the first interconnect dielectric material layer 12. The first etch stop layer 22 can have a thickness from 5 nm to 20 nm; however other thicknesses for the first etch stop layer 22 are contemplated and can be used as the thickness of the first etch stop layer 22.

Parylene is considered by some to be an ultimate coating for protection of surfaces in electronics. Parylene is the common name of a polymer whose backbone is composed of para-benzenediyl rings connected to 1,2-ethanediyl bridges. It can be obtained by polymerization of para-xylylene. Parylene can be deposited at room temperature, is chemically stable, makes an excellent barrier material, has excellent thermal endurance as well as excellent mechanical properties and high tensile strength.

Figure 5:
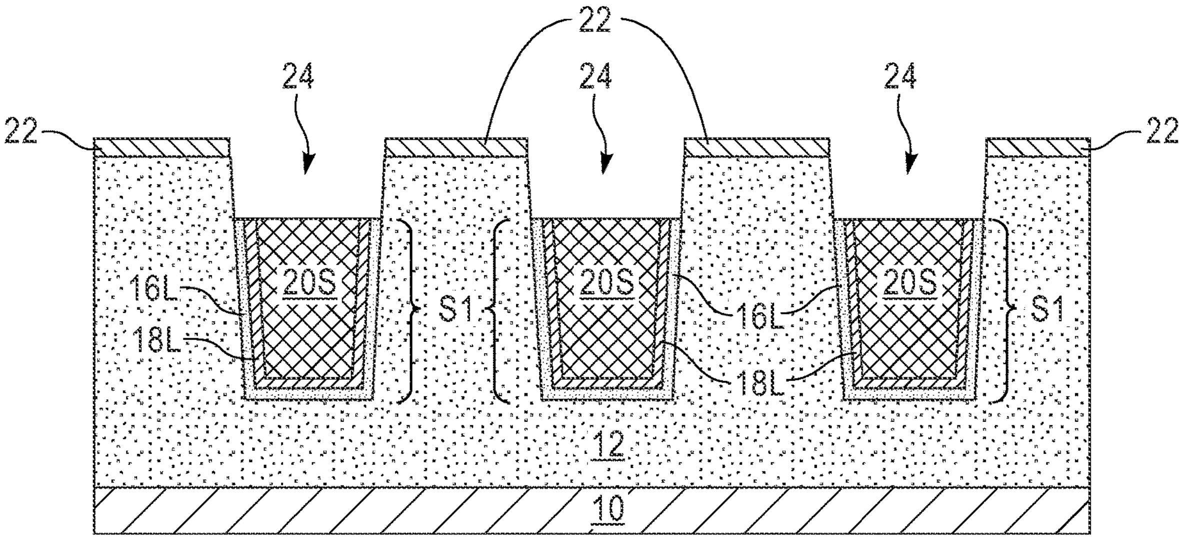
FIG. 5 is a cross sectional view of the exemplary structure shown in FIG. 4 after recessing the first diffusion barrier material layer, the first metal liner material layer, and the first electrically conductive metal-containing layer that were maintained in each line opening.

Referring now to FIG. 5, there is illustrated the exemplary structure shown in FIG. 4 after recessing the first diffusion barrier material layer, the first metal liner material layer, and the first electrically conductive metal-containing layer that were maintained in each line opening 14. That is, this step of the present application recesses the first diffusion barrier liner 16L, the first metal liner 18L and the electrically conductive line structure 20S that are present in the line openings 14 forming a gap 24 above a recessed structure S1 containing recessed portions of each of the first diffusion barrier liner 16L, the first metal liner 18L and the electrically conductive line structure 20S that is present in the line openings 14. The recessing of the first diffusion barrier liner 16L, the first metal liner 18L and the electrically conductive line structure 20S includes the use of a metal etching process that selective removes the first diffusion barrier liner 16L, the first metal liner 18L and the electrically conductive line structure 20S relative to the first etch stop layer 22 and the first interconnect dielectric material layer 12.

The recessed structure S1 containing recessed portions of each of the first diffusion barrier liner 16L, the first metal liner 18L and the electrically conductive line structure 20S that is present in the line openings 14 includes U-shaped liners and has coplanarity as mentioned above for the non-recessed recessed first diffusion barrier liner 16L, first metal liner 18L and electrically conductive line structure 20S that is present in the line openings 14. The recessed structure S1 has a topmost surface that is vertically offset and located beneath a topmost surface of the first interconnect dielectric material later 12. Other recessed structure S1 configurations are possible depending on whether the first diffusion barrier layer 16 and/or the first metal liner material layer 18 are employed. Recessed structure S1 can be referred to as a recessed electrically conductive line structure.

Figure 6:
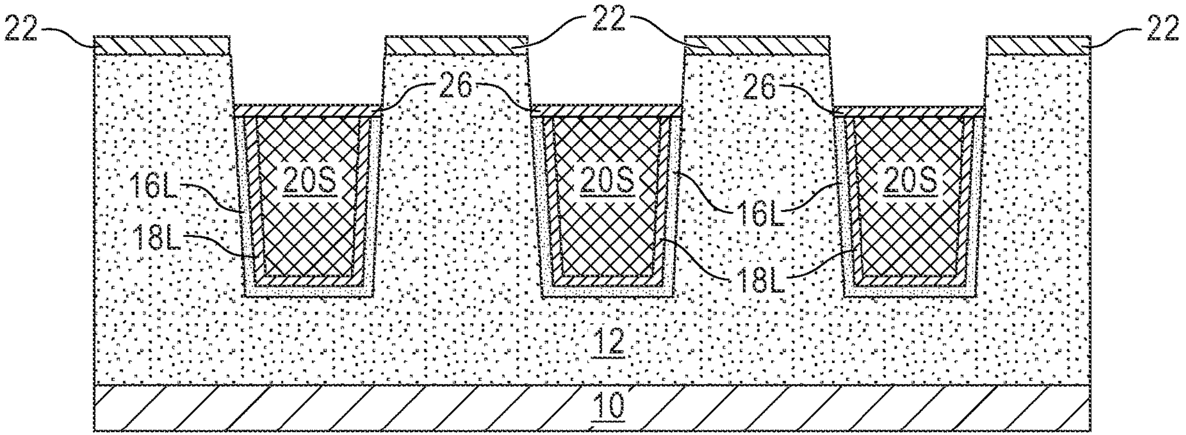
FIG. 6 is a cross sectional view of the exemplary structure shown in FIG. 5 after forming a metallic cap on the recessed surfaces of the first diffusion barrier material layer, the first metal liner material layer, and the first electrically conductive metal-containing layer that were maintained in each line opening.

Referring now to FIG. 6, there is illustrated the exemplary structure shown in FIG. 5 after forming a metallic cap 26 on the recessed surfaces of the first diffusion barrier material layer, the first metal liner material layer, and the first electrically conductive metal-containing layer that were maintained in each line opening 14. That is, this step of the present application forms a metallic cap 26 of the recessed structure S1 containing the recessed portions of each of the first diffusion barrier liner 16L, the first metal liner 18L and the electrically conductive line structure 20S that is present in the line openings 14.

The metallic cap 26 can be composed of a metal such as, for example, Ta, Ti, W, Co, Ru, or Rh, a metal nitride such as, for example, TaN, TiN, WN, CoN, RuN or RhN, or alloys of said metals (e.g., Ta and one of Ti, W, Co, Ru, or Rh; Ti and one of Ta, W, Co, Ru, or Rh; W and one of Ta, Ti, Co, Ru or Rh; Co and one of Ta, Ti, W, Ru or Rh; Ru and one of Ta, Ti, W, Co, or Rh; of Rh and one of Ta, Ti, W, Co, or Ru). The metallic cap 26 can be composed of a compositionally same, or compositionally different, material than the first metal liner 18L The metallic cap 26 covers an entirety of a topmost surface of the recessed structure S1 containing recessed portions of each of the first diffusion barrier liner 16L, the first metal liner 18L and the electrically conductive line structure 20S that is present in the line openings 14.

The metallic cap 26 can be formed by a selective deposition process in which the metallic cap 26 is formed only upon the topmost surface of the recessed structure S1 containing recessed portions of each of the first diffusion barrier liner 16L, the first metal liner 18L and the electrically conductive line structure 20S that is present in the line openings 14. The metallic cap 26 can have a thickness from 5 nm to 20 nm; however other thicknesses for the metallic cap 26 are contemplated and can be used as the thickness of the metallic cap 26.

Figure 7:
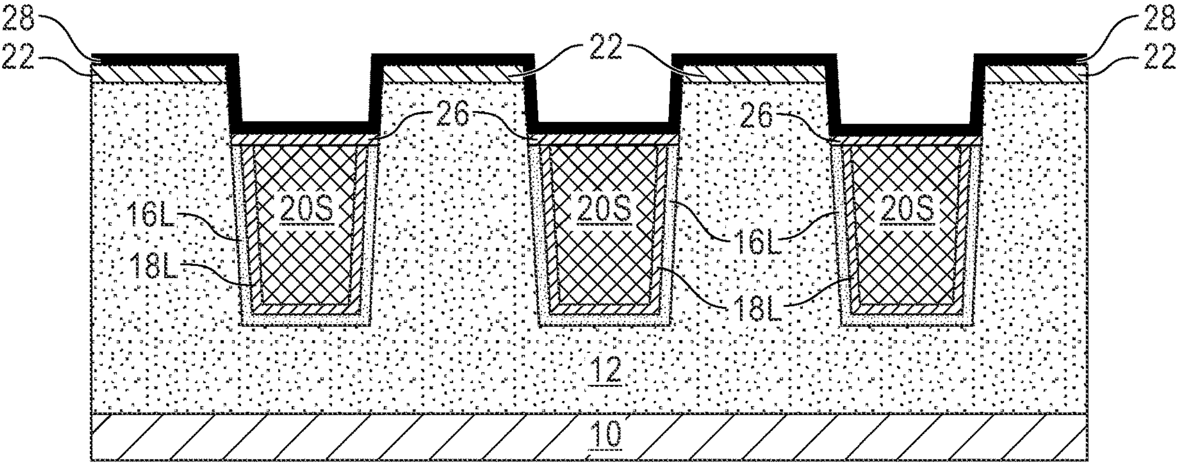
FIG. 7 is a cross sectional view of the exemplary structure shown in FIG. 6 after forming a second etch stop layer on the first etch stop layer and in an upper portion of each line opening.

Referring now to FIG. 7, there is illustrated the exemplary structure shown in FIG. 6 after forming a second etch stop layer 28 on the first etch stop layer 22 and in an upper portion (i.e., gap 24) of each line opening 14. Unlike the first etch stop layer 22, the second etch stop layer 28 is a continuous layer that is formed on all physically exposed surfaces of the exemplary structure shown in FIG. 6. The second etch stop layer 28 is composed of a second etch stop material that is compositionally different from the first etch stop material that provides the first etch stop layer 22.

Illustrative examples of second etch stop materials that can be employed as the second etch stop layer 28 include, but are not limited to, SiN, SiC, SiCN, SiNO, SiCO or aluminum oxide (if aluminum oxide, is not used as the first etch stop layer 22).

The second etch stop layer 28 can be formed by a deposition process such as, for example, CVD, PECVD, ALD, PVD or spin-on coating. The second etch stop layer 28 is typically a conformal material layer. The second etch stop layer 28 can have a thickness from 5 nm to 20 nm; however other thicknesses for the second etch stop layer 28 are contemplated and can be used as the thickness of the second etch stop layer 28.

Figure 8:
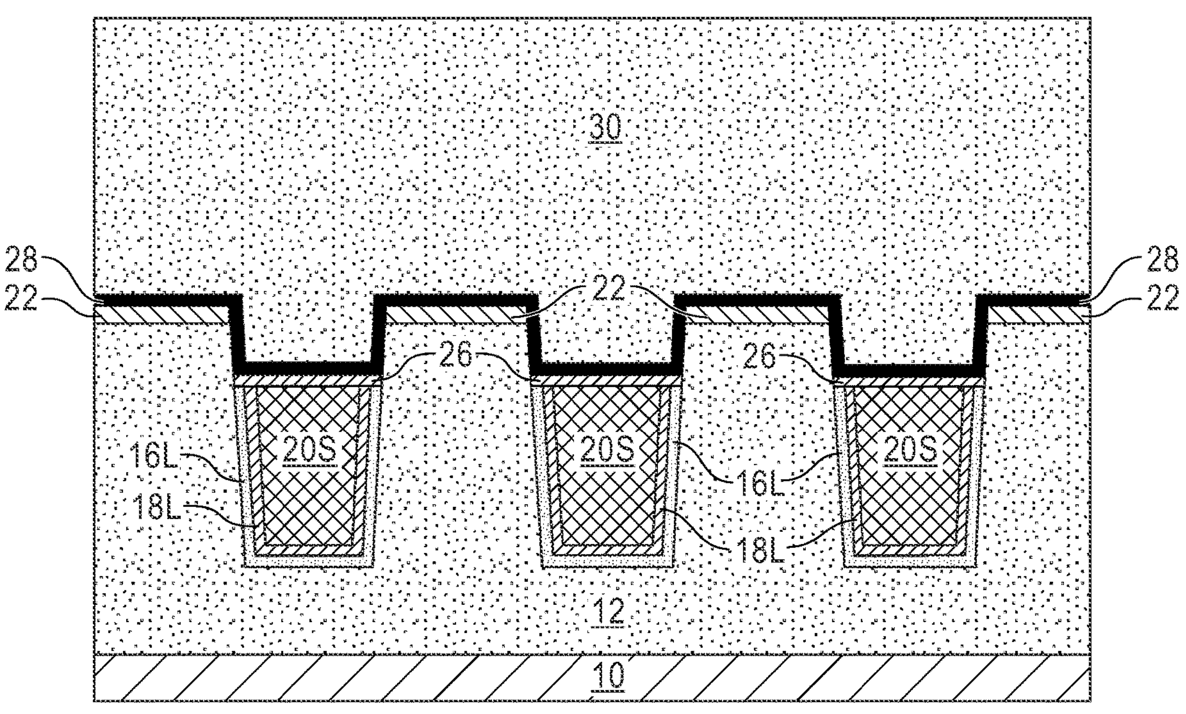
FIG. 8 is a cross sectional view of the exemplary structure shown in FIG. 7 after forming a second interconnect dielectric material layer on the second etch stop layer.

Referring now to FIG. 8, there illustrated the exemplary structure shown in FIG. 7 after forming a second interconnect dielectric material layer 30 on the second etch stop layer 28. The second interconnect dielectric material layer 30 is composed of one of the dielectric materials mentioned above for the first interconnect dielectric material layer 12. The dielectric material that provides the second interconnect dielectric material layer 30 can be compositionally the same as, or compositionally different from, the dielectric material that provides the first interconnect dielectric material layer 12. The second interconnect dielectric material layer 30 can be formed utilizing one of the deposition techniques mentioned above in forming the first interconnect dielectric material layer 12. The second interconnect dielectric material layer 30 has a planar topmost surface.

Figure 9:
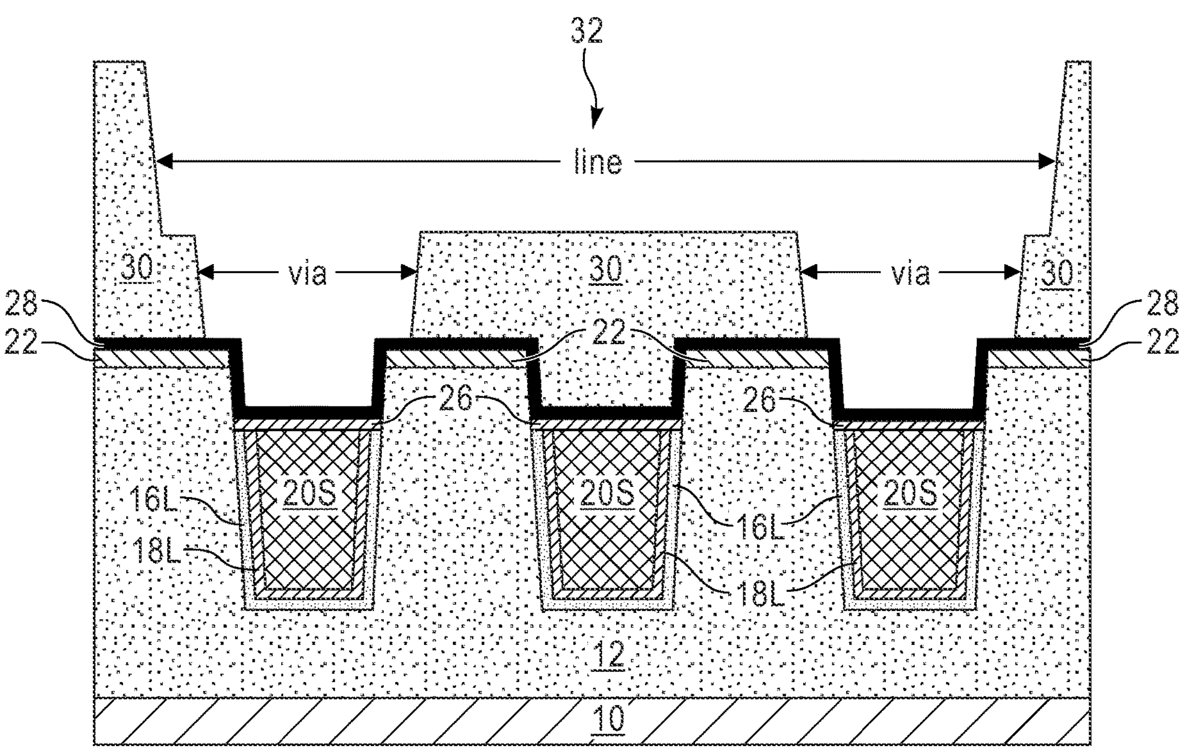
FIG. 9 is a cross sectional view of the exemplary structure shown in FIG. 8 after forming a combined via/line opening into the second interconnect dielectric material layer utilizing a dual damascene patterning process, the combined via/line opening contains a line portion and at least one via portion, wherein the line portion is located above, and in communication with the at least one via portion.

Referring now to FIG. 9, there is illustrated the exemplary structure shown in FIG. 8 after forming a combined via/line opening 32 into the second interconnect dielectric material layer 30 utilizing a dual damascene patterning process, the combined via/line opening 32 contains an upper line (or trench) portion and at least one lower via portion. The damascene patterning process includes a first lithography and etching step followed by a second lithography and etching step. As is shown, the upper line portion of the combined via/line opening 32 has a width that is greater than a width of the at least one lower via portion. The at least one via portion of the combined via/line opening 32 physically exposes the second etch stop layer 28 that is present at least in the gap 24. Although two via portions are shown in the combined via/line opening 32, the present application contemplates embodiments wherein only a single via portion is formed, or embodiments wherein more than two via portions are formed.

Figure 10A:
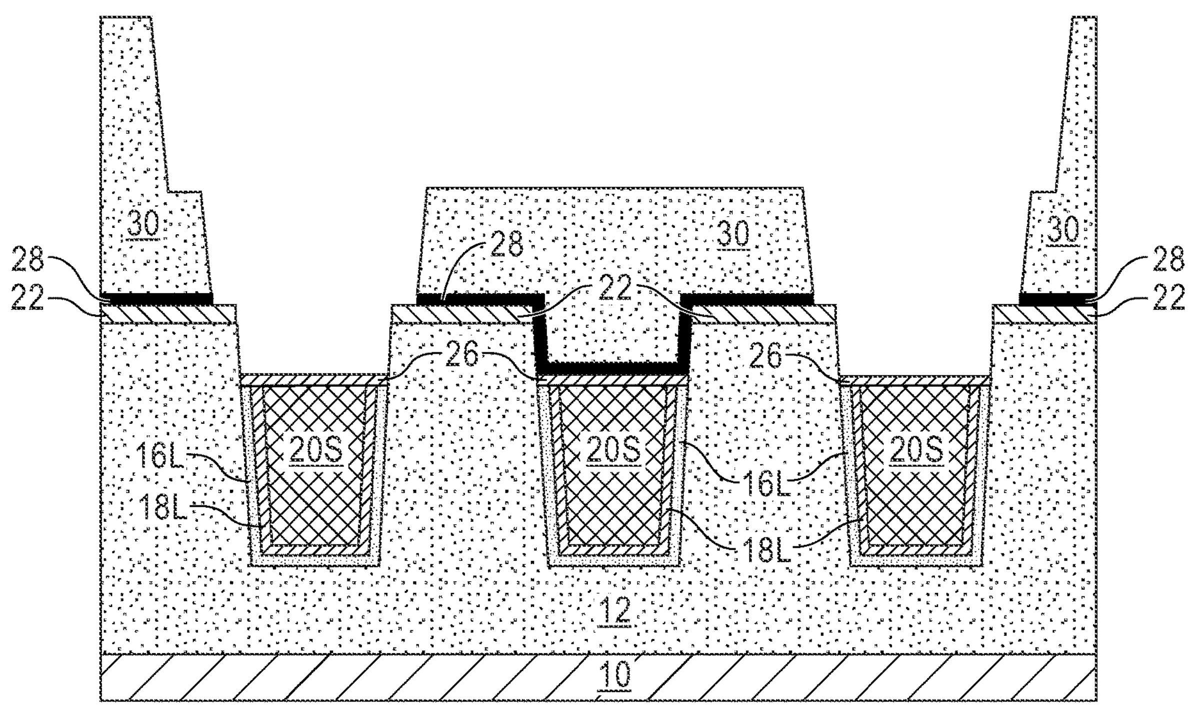
FIGS. 10A and 10B are cross sectional views of the exemplary structure shown in FIG. 9 after removing at least physically exposed portions of the second etch stop layer in the at least one via portion.
Figure 10B:
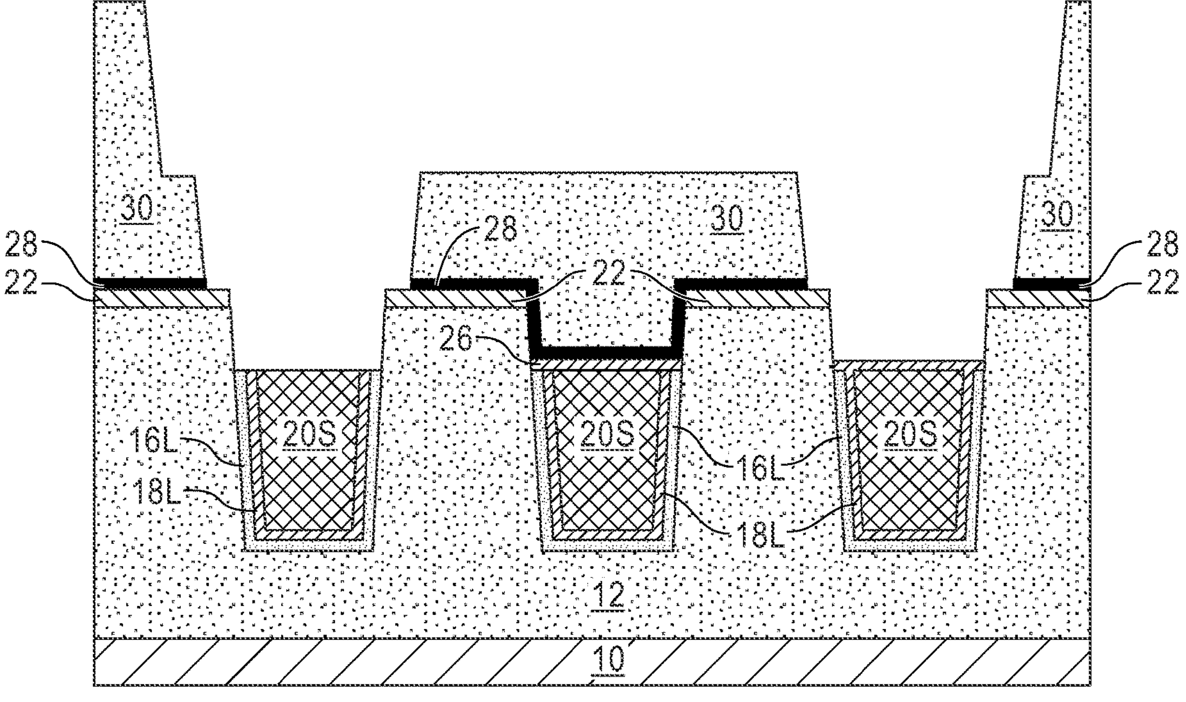

Referring now to FIGS. 10A and 10B, there are illustrated the exemplary structure shown in FIG. 9 after removing at least physically exposed portions of the second etch stop layer 28 in the at least one via portion of combined via/line opening 32. FIG. 10A shows an embodiment in which the etch used to remove the physically exposed portion of the second stop layer 28 stops on the metallic cap 26. FIG. 10B shows another embodiment in which the metallic cap 26 is also removed. At least physically exposed portions of the second etch stop layer 28 will be removed selectively by either dry etching or a wet etching process. Metallic cap 26, as discussed below, can also be removed, See FIG. 10B. It is noted that this etch does not affect the sidewalls of the first interconnect dielectric material layer 12 that are now physically exposed as is shown in FIGS. 10A and 10B. In one example, the etch is a chemical wet etching process in which dilute hydrofluoric acid (dHF) is used as the etchant.

Depending on the composition of the metallic cap 26 and the underlying electrically conductive line structure 20S, the metallic cap 26 can be removed at this point of the present application to reveal the electrically conductive line structure 20S that is beneath each via portion of combined via/line opening 32. For example, and on one hand, when the metallic cap 26 is composed of Co, and Co is also used for the electrically conductive material of the electrically conductive line structure 20S, then the Co metallic cap should be removed from the exemplary structure. On the other hand, and when the metallic cap 26 is composed of Ru, and Co is also used for the electrically conductive material of the electrically conductive line structure 20S, then the Ru metallic cap can remain in the exemplary structure. In embodiments in which the metallic cap 26 needs to be removed, the metallic cap 26 can be removed during the removal of the second etch stop layer 28, or after removing the second etch stop layer utilizing another etching process that is selective in removing the metallic cap 26.

Figure 11:
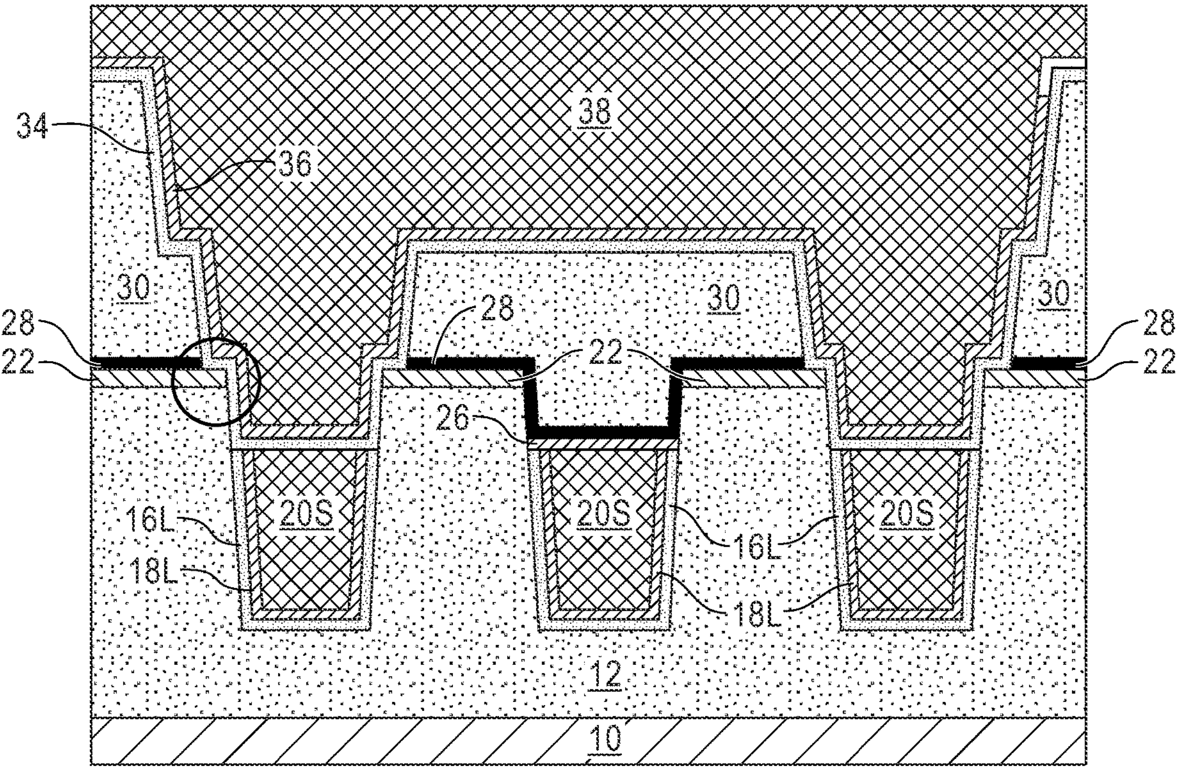
FIG. 11 is a cross sectional view of the exemplary structure shown in FIG. 10B after forming a second diffusion barrier material layer, a second metal liner material layer, and a second electrically conductive metal-containing layer in the opening present in the second interconnect dielectric material layer and on top of the second interconnect dielectric material layer.

Referring now to FIG. 11, there is illustrated the exemplary structure shown in FIG. 10B after forming a second diffusion barrier material layer 34, a second metal liner material layer 36, and a second electrically conductive metal-containing layer 38 in the combined via/line opening 32 present in the second interconnect dielectric material layer 30 and on top of the second interconnect dielectric material layer 30. This step of the present application, as well as the step to follow, can be performed on the exemplary structure shown in FIG. 10A. In some embodiments, the second diffusion barrier material layer 34 and/or the second metal line material layer 36 can be omitted.

The second diffusion barrier material layer 34 includes one of the diffusion barrier materials mentioned above for the first diffusion barrier material layer 16. The second diffusion barrier material layer 34 can be composed of a compositionally same, or compositionally different, diffusion barrier material than the first diffusion barrier layer 16. The second diffusion barrier material layer 34 can be formed utilizing one of the deposition processes mentioned above for forming the first diffusion barrier material layer 16, and the second diffusion barrier material layer 34 can have a thickness within the thickness range mentioned above for the first diffusion barrier material layer 16.

The second metal liner material layer 36 includes one of the metals or metal alloys mentioned above for the first metal liner material layer 18. The second metal liner material layer 36 can be composed of a compositionally same, or compositionally different, metal or metal alloy than the first metal liner material layer 18. The second metal liner material layer 36 can be formed utilizing one of the deposition processes mentioned above for forming the first metal liner material layer 18, and the second metal liner material layer 36 can have a thickness within the thickness range mentioned above for the first metal liner material layer 18.

The second electrically conductive metal-containing layer 38 includes one of the electrically conductive materials mentioned above for the first electrically conductive metal-containing layer 20. The second electrically conductive metal-containing layer 38 can be composed of a compositionally same, or compositionally different, electrically conductive material than the first electrically conductive metal-containing layer 20. The second electrically conductive metal-containing layer 38 can be formed utilizing one of the deposition processes mentioned above for forming the first electrically conductive metal-containing layer 20, and the second electrically conductive metal-containing layer 38 can have a thickness within the thickness range mentioned above for the first electrically conductive metal-containing layer 20.

Figure 12A:
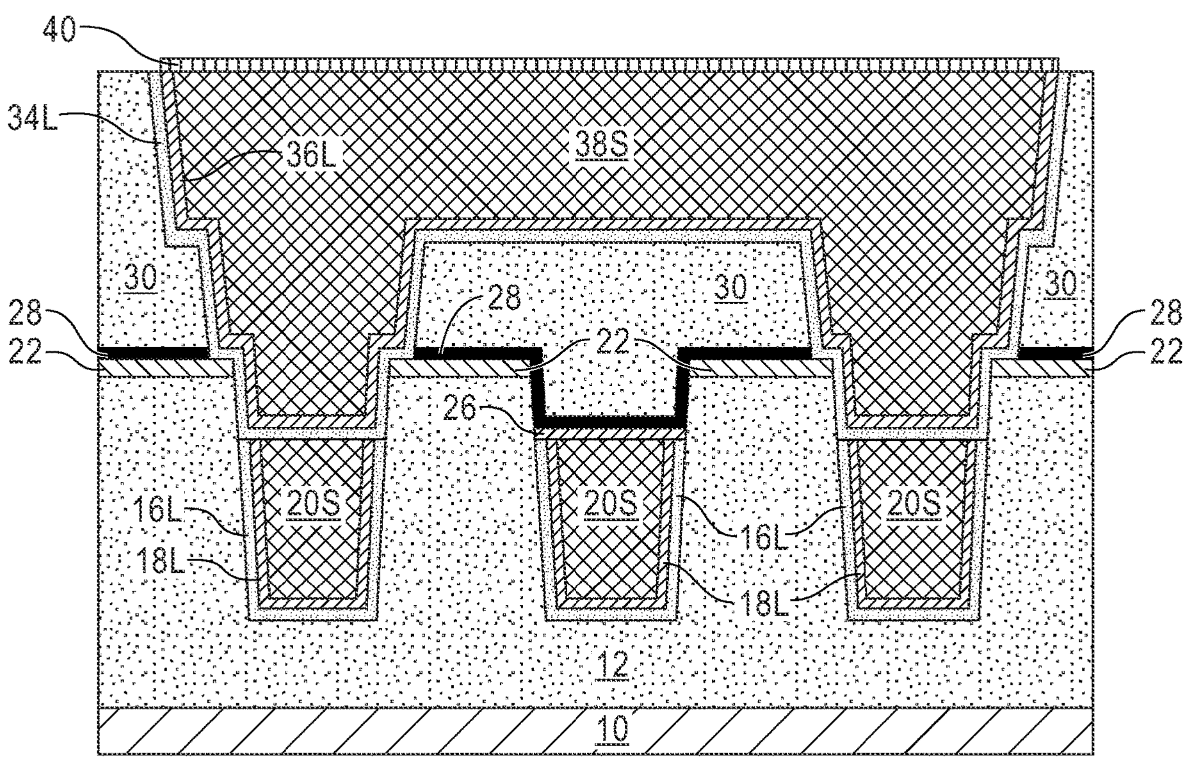
FIG. 12A is a cross sectional view of the exemplary structure shown in FIG. 11 after removing the second diffusion barrier material layer, the second metal liner material layer, and the second electrically conductive metal-containing layer that are located on top of the second interconnect dielectric material layer, while maintaining the second diffusion barrier material layer, the second metal liner material layer, and the second electrically conductive metal-containing layer in the combined via/line opening present in the second interconnect dielectric material layer, and forming another metallic cap on the second diffusion barrier material layer, the second metal liner material layer, and the second electrically conductive metal-containing layer that is maintained in the opening present in the second interconnect dielectric material layer.
Figure 12B:
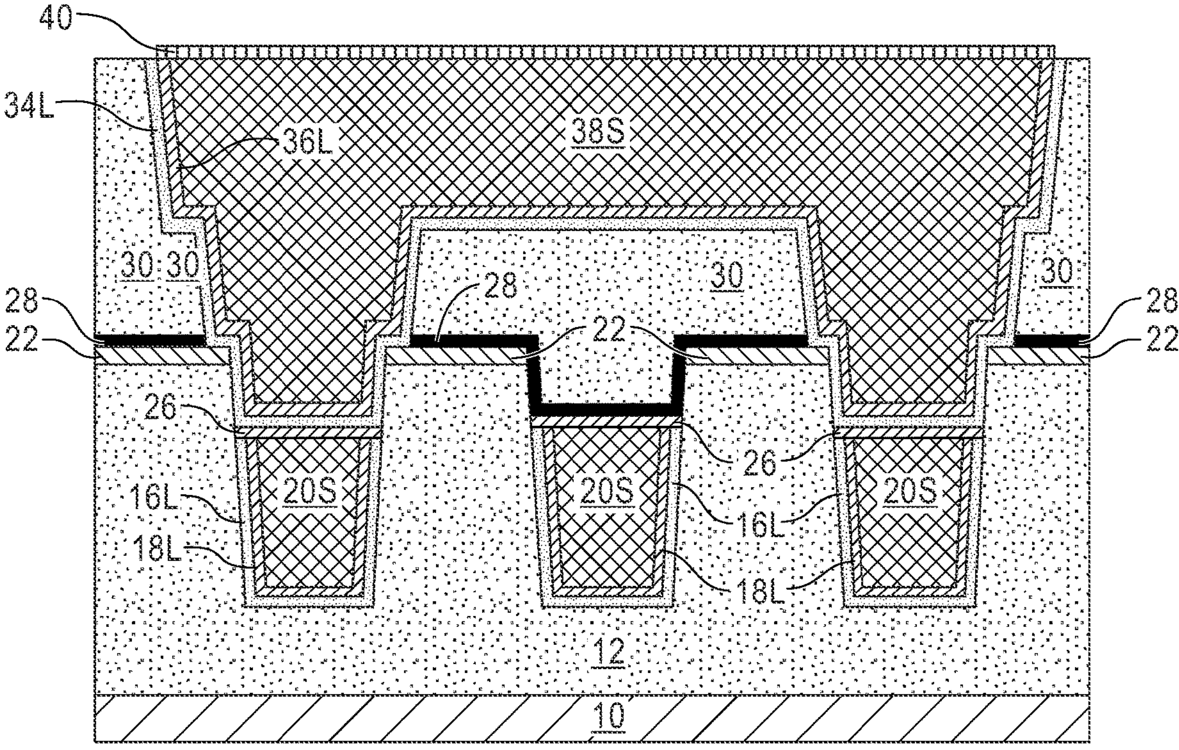
FIG. 12B is a cross sectional view of the exemplary structure shown in FIG. 10A after formation of at least a combined via/line electrically conductive structure in the opening that is present in the second interconnect dielectric material layer.

The circled portion highlighted in FIG. 11 shows an interconnect structure in which the first etch stop layer 22 protects the first interconnect dielectric material layer 12 from eroding during the metallization used to provide the combined via/line electrically conductive structure 38S (See, FIGS. 12A and 12B). That is, the first etch stop layer 22 prevents modification of the via profile of the interconnect structure of the present application. The interconnect structure has a low resistance due to the maximized contact between the via portion of combined via/line electrically conductive structure 38S and the underlying first electrically conductive line structure 20S. Moreover, no bowing or metal fangs are formed when the first etch stop layer 22 is present on the horizontal topmost surface of the first interconnect dielectric material layer 12. It is noted that the first etch stop layer 22 also prevents metal residue from being introduced into the first interconnect dielectric material layer 12 during the metallization step mentioned above.

Referring now to FIG. 12A, there is shown the exemplary structure shown in FIG. 11 after removing the second diffusion barrier material layer 34, the second metal liner material layer 36, and the second electrically conductive metal-containing layer 38 that are located on top of the second interconnect dielectric material layer 30, while maintaining the second diffusion barrier material layer 34, the second metal liner material layer 38, and the second electrically conductive metal-containing layer 38 in the combined via/line opening 32 present in the second interconnect dielectric material layer 30, and forming another metallic cap 40 on the second diffusion barrier material layer, the second metal liner material layer, and the second electrically conductive metal-containing layer that is maintained in the combined via/line opening 32 present in the second interconnect dielectric material layer 30. In some embodiments (not shown), metallic cap 40 can be omitted. In yet other embodiments (also not shown) not shown, the maintained materials within the combined via/line opening 32 can be recessed and then metallic cap 40 is formed upon the recessed material within the combined via/line opening 32.

The second diffusion barrier material layer 34 that is maintained in combined via/line opening 32 can be referred to herein as a second diffusion barrier liner 34L. The second metal liner material layer 36 that is maintained in combined via/line opening 32 can be referred to herein as a second metal liner 36L. The second electrically conductive metal-containing layer 38 that is maintained in combined via/line opening 32 can be referred to herein as a combined via/line electrically conductive structure 38S.

In the illustrated embodiment, the combined via/line electrically conductive structure 38S has a topmost surface that is coplanar with a topmost surface of each of the second diffusion barrier liner 34L, the second metal liner 36L, and the second interconnect dielectric material layer 30. Other structural configurations are possible depending on whether the second diffusion barrier material layer 34 and the second metal liner material layer 36 are employed.

The removal of the second diffusion barrier material layer 34, the second metal liner material layer 36, and the second electrically conductive metal-containing layer 38 that are located on top of the second interconnect dielectric material layer 30 can be performed utilizing a planarization process such as, for example, chemical mechanical polishing (CMP) and/or grinding. In the illustrated embodiment, the planarization stops on a topmost surface of the second interconnect dielectric material layer 30.

Metallic cap 40 includes one of the metal-containing cap materials mentioned above for metallic cap 26. Metallic cap 40 can be composed of a compositionally same, or compositionally different metal-containing cap material than metallic cap 26. The metallic cap 40 can be formed, and have a thickness, as described above for metallic cap 26.

Referring now to FIG. 12B, there is shown the exemplary structure shown in FIG. 10A after formation of at least a combined via/line electrically conductive structure 38S in combined via/line opening 32 that is present in the second interconnect dielectric material layer 30. Notably, the exemplary structure shown in FIG. 12B can be formed utilizing the processes steps described above for forming the exemplary structures shown in FIGS. 11 and 12A.

Notably, FIGS. 12A and 12B illustrate interconnect structures of the present application. The interconnect structures illustrated in FIGS. 12A and 12B include electrically conductive line structure 20S embedded in first interconnect dielectric material layer 12. Combined via/line electrically conductive structure 38S is also present and is embedded in second interconnect dielectric material layer 30 that is located above the first interconnect dielectric material layer 12. The combined via/line electrically conductive structure 38S includes a lower via portion and an upper line portion, wherein the lower via portion of the combined via/line electrically conductive structure 38S is fully-aligned to the electrically conductive line structure 20S embedded in the first interconnect dielectric material layer 12. A dual etch stop layer structure is also present that includes first etch stop layer 22 and second etch stop layer 28. The dual etch stop layer structure is located between the first interconnect dielectric material layer 12 and the second interconnect dielectric layer 30, and the first etch stop layer 22 forms an interface with a topmost surface of the first interconnect dielectric material layer 12. It is noted that the lower via portion of the combined via/line electrically conductive structure 38S extends beneath a topmost surface of the first interconnect dielectric material layer 12 and is present in a same line opening 14 that contains the electrically conductive line structure 20S.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. An interconnect structure comprising:

an electrically conductive line structure embedded in a first interconnect dielectric material layer;

a combined via/line electrically conductive structure embedded in a second interconnect dielectric material layer that is located above the first interconnect dielectric material layer, wherein the combined via/line electrically conductive structure includes a lower via portion and an upper line portion, wherein the lower via portion of the combined via/line electrically conductive structure is fully-aligned to the electrically conductive line structure embedded in the first interconnect dielectric material layer; and a dual etch stop layer structure located between the first interconnect dielectric material layer and the second interconnect dielectric material layer and comprising a first etch stop layer and a second etch stop layer, wherein both the first etch stop layer and the second etch stop layer are located beneath the upper line portion of the combined via/line electrically conductive structure and disposed adjacent to a sidewall of the lower via portion in a region between a top portion and a bottom portion of the lower via portion of the combined electrically conductive structure, the first etch stop layer forms an interface with a topmost surface of the first interconnect dielectric material layer, and the second etch stop layer partially, but not entirely, covers a topmost surface of the first etch stop layer.

2. The interconnect structure of claim 1, wherein the lower via portion of the combined via/line electrically conductive structure is present in a line opening that also contains the electrically conductive line structure.

3. The interconnect structure of claim 1, wherein the electrically conductive line structure is a recessed structure having a topmost surface that is vertically offset and located beneath the topmost surface of the first interconnect dielectric material layer.

4. The interconnect structure of claim 3, further comprising a metallic cap located on the topmost surface of the recessed structure.

5. The interconnect structure of claim 1, further comprising at least a first diffusion barrier liner located between the electrically conductive line structure and the first interconnect dielectric material layer.

6. The interconnect structure of claim 5, further comprising a first metal liner located between the first diffusion barrier liner and the electrically conductive line structure.

7. The interconnect structure of claim 5, further comprising at least a second diffusion barrier liner located between the combined via/line electrically conductive structure and the second interconnect dielectric material layer.

8. The interconnect structure of claim 7, further comprising a second metal liner located between the second diffusion barrier liner and the combined via/line electrically conductive structure.

9. The interconnect structure of claim 1, wherein the lower via portion of the combined via/line electrically conductive structure extends beneath the topmost surface of the first interconnect dielectric material layer and is present in a line opening that further contains the electrically conductive line structure.

10. The interconnect structure of claim 1, wherein the first etch stop layer is composed of a first etch stop material, and the second etch stop layer is composed of a second etch stop material that differs from the first etch stop material.

11. The interconnect structure of claim 10, wherein the first etch stop material is composed of paralyene.

12. The interconnect structure of claim 11, wherein the second etch stop material is composed of SiN, SiC, SiCN, SiNO, SiCO or aluminum oxide.

13. The interconnect structure of claim 10, wherein the first etch stop material is composed of aluminum oxide, and the second etch stop material is composed of SiN, SiC, SiCN, SiNO or SiCO.

14. The interconnect structure of claim 1, wherein the first etch stop layer is present only on the first interconnect dielectric material layer.

15. The interconnect structure of claim 1, wherein the first interconnect dielectric material layer is absent of metallic residue or metallic fangs.

16. The interconnect structure of claim 1, further comprising a metallic cap located on a topmost surface of the combined via/line electrically conductive structure.

* * * * *